United States Patent [19]

Duerr et al.

[11] Patent Number: 5,467,017

[45] Date of Patent: Nov. 14, 1995

[54] ANTENNA ARRANGEMENT FOR A NUCLEAR MAGNETIC RESONANCE APPARATUS

[75] Inventors: Wilhelm Duerr, Erlangen, Germany; Norihiko Mikoshiba, Ebina, Japan; Yutaka Watanabe, Erlangen, Germany

[73] Assignee: Siemens Aktiengesellschaft, Munich, Germany

[21] Appl. No.: 129,314

[22] Filed: Sep. 30, 1993

[30] Foreign Application Priority Data

Sep. 30, 1992 [DE] Germany .............. 42 32 884.5

[51] Int. Cl.$^6$ ............................................ G01R 33/28
[52] U.S. Cl. .............................. 324/318; 324/322
[58] Field of Search ................... 324/318, 322, 324/300; 128/653.5; 335/301, 299, 302

[56] References Cited

U.S. PATENT DOCUMENTS

| | | | |
|---|---|---|---|
| 4,506,224 | 3/1985 | Krause | 324/319 |
| 4,642,569 | 2/1987 | Hayes et al. | 324/318 |
| 4,680,550 | 7/1987 | Krause | 324/318 |
| 4,862,086 | 8/1989 | Maeda | 324/318 |
| 4,879,515 | 11/1989 | Roemer et al. | 324/322 |
| 4,968,937 | 11/1990 | Akgun | 324/318 |
| 4,978,920 | 12/1990 | Mansfield et al. | 324/318 |
| 4,980,641 | 12/1990 | Breneman et al. | 324/318 |
| 5,081,418 | 1/1992 | Hayes et al. | 324/318 |
| 5,128,615 | 7/1992 | Oppelt et al. | 324/322 |
| 5,159,929 | 11/1992 | Morris et al. | 324/318 |
| 5,243,286 | 9/1993 | Rzedzian et al. | 324/318 |
| 5,266,898 | 11/1993 | Konishi | 324/318 |
| 5,270,656 | 12/1993 | Roberts et al. | 324/322 |
| 5,304,932 | 4/1994 | Carlson | 324/322 |

FOREIGN PATENT DOCUMENTS

| | | |
|---|---|---|
| 0151726 | 8/1985 | European Pat. Off. . |
| 0318257 | 5/1989 | European Pat. Off. . |
| 0359374 | 3/1990 | European Pat. Off. . |

*Primary Examiner*—Sandra L. O'Shea
*Assistant Examiner*—Raymond Y. Mah
*Attorney, Agent, or Firm*—Hill, Steadman & Simpson

[57] ABSTRACT

An antenna arrangement for a nuclear magnetic resonance apparatus, the apparatus having a magnet which generates a basic magnetic field between two pole plates, includes a sub-antenna disposed at each pole plate, each sub-antenna being composed of a closed, grounded shielding facing toward the pole plate and a planar conductor structure disposed a distance from the shielding and substantially parallel thereto, into which a high-frequency current is fed.

43 Claims, 10 Drawing Sheets

ANTENNA ARRANGEMENT FOR A NUCLEAR MAGNETIC RESONANCE APPARATUS

BACKGROUND OF THE INVENTION

1. Field of the Invention

The present invention is directed to an antenna arrangement for a nuclear magnetic resonance apparatus for exciting nuclear spins in an examination subject and for receiving the resulting magnetic resonance signals from the subject.

2. Description of the Prior Art

As is known, magnetic radiant fields and radio-frequency fields for the excitation of nuclear spins in a subject are required in addition to a strong basic magnetic field in a nuclear magnetic resonance imaging apparatus. A Helmholtz coil arrangement, with the examination lying in the interior thereof, is generally employed in combination with superconducting magnets, which generate the basic magnetic field. The direction of the basic magnetic field thus lies along the longitudinal direction of the patient to be examined. A radio-frequency field is generated for deflecting the nuclear spins, this field having magnetic field components in directions extending perpendicularly relative to the direction of the basic magnetic field. An antenna structure as disclosed in U.S. Pat. No. 4,506,224, for example, can be employed for this purpose. In this structure, rods extend in the longitudinal direction of the magnet, i.e., in the direction of the basic magnetic field.

Nuclear magnetic tomography systems are also known wherein the basic magnetic field is generated by an electromagnet or a permanent magnet. These types of magnets usually have a C-shape or an H-shape, or are constructed with four columns. The basic magnetic field is generated between two pole plates, and thus extends perpendicularly relative to the longitudinal direction of the patient. The open examination space of such magnet structures has a number of advantages over the closed, tubular examination space which is standard in the case of a superconducting magnet. The examination volume remains relatively accessible during the examination, so that examinations requiring the intervention of a physician or attending personnel can be implemented. Additionally, the risk that the patient being examined will suffer from claustrophobic conditions is remote in such open magnet systems.

For magnets having pole plates, there is a desire to keep the pole plate spacing as small as possible, so that the weight of the magnet remains low, and a better homogeneity of the basic magnetic field can be achieved. Any components which are built-in between the pole plates, for example the radio-frequency antennas, must therefore be kept as flat as possible. Such antennas must also be shaped so that accessibility to the examination volume for interventional examinations is not impeded.

European Application 0 359 374 discloses an antenna arrangement wherein each pole plate has a sub-antenna with relatively large-area conductors, as well as with a return conductor, allocated thereto. The large-area conductors interact with the return conductor as a transmission line that is tuned to the radio-frequency. The large-area conductors at the two pole plates are respectively supplied with current flowing in opposite directions. A disadvantageous of this known arrangement is that disturbances in the radio-frequency distribution are caused by the return conductor.

SUMMARY OF THE INVENTION

It is an object of the present invention to provide an antenna arrangement for exciting nuclear spins in an examination subject in a nuclear magnetic resonance apparatus, and for receiving the resulting nuclear magnetic resonance signals, which can be executed with a substantially flat structure and which achieves good field homogeneity and sensitivity.

The above objects are achieved in accordance with the principles of the present invention in an antenna arrangement for a nuclear magnetic resonance apparatus of the type wherein a basic magnetic field is generated between two pole plates, the antenna arrangement having a sub-antenna disposed at each pole plate, each sub-antenna arrangement including a grounded shielding substantially impermeable to radio frequency fields facing the pole plate and each sub-antenna having a conductor structure preceding formed by at least one flat electrical conductor disposed a distance from the shielding and substantially parallel thereto, which is fed with a high-frequency current. The respective conductor structures allocated to the two pole plates have current flowing therein in opposite directions. A good homogeneity of the generated radio-frequency field is achieved with the structure of the shielding and conductors.

If the spacing between the forward and the shield, and its associated return conductor and the shield, is identical, the sensitivity of the conductor arrangement is significantly higher than in known forward-return conductor arrangements. This can be easily appreciated by imagining the shield as being replaced by a corresponding mirror current to the current in the conductor. The resulting current dipole then has a spacing which is twice the actual spacing between the forward and return conductors, and consequently generates a correspondingly higher useful field than the simple forward-return conductor arrangement given the same current.

A good decoupling between the gradient system and the RF system is also achieved in the antenna arrangement of the invention, resulting in outside disturbances being substantially suppressed.

DESCRIPTION OF THE PREFERRED EMBODIMENTS

Figure 1:
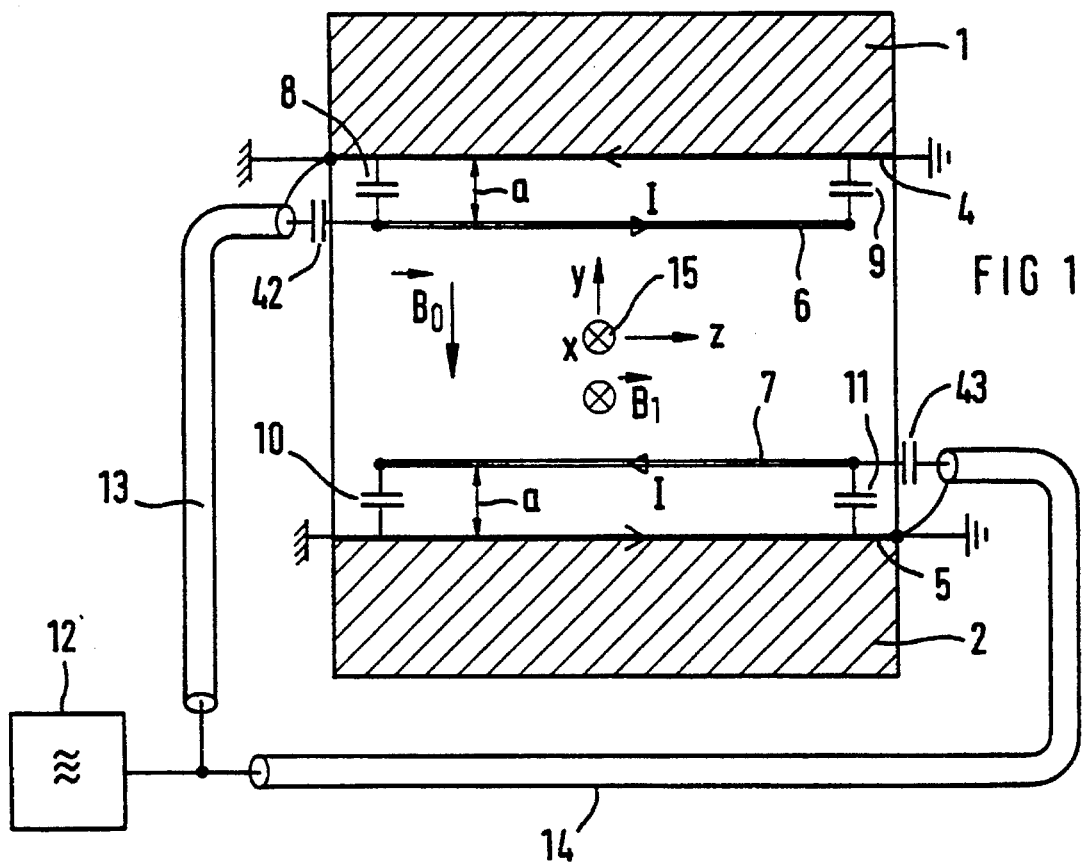
FIG. 1 is a schematic illustration, in a front view, of an exemplary embodiment of an antenna arrangement constructed in accordance with the principles of the present invention.
Figure 2:
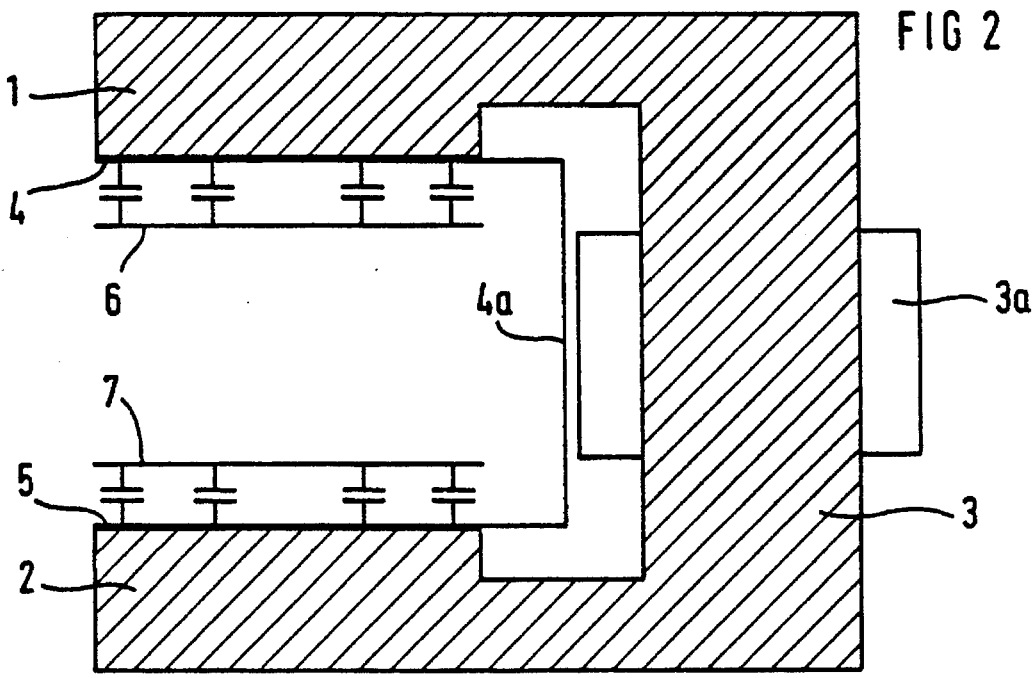
FIG. 2 is a side view of the embodiment of FIG. 1.

The basic principles of the invention shall be described with reference to the schematic illustrations of FIGS. 1 and 2, with FIG. 1 showing a front view and FIG. 2 showing a side view of an antenna arrangement in accordance with the principles of the invention. A C-shaped magnet having two pole plates 1 and 2 and a yoke 3 is employed in this exemplary embodiment. The magnetic field is generated by a coil 3a.

Although shim coils for improving the basic field homogeneity, and the gradient coils required for a nuclear magnetic tomography apparatus, will normally be present, those coils are omitted in FIGS. 1 and 2 for clarity, since they do not form a part of the invention.

A grounded radio-frequency shielding 4 is provided at the pole plate 1, and an identical shielding 5 is disposed at the pole plate 2. The two radio-frequency shieldings 4 and 5 can be connected to each other in the region of the yoke 3 by a connection 4a, so that the overall shielding has a U-shape and is open at the side facing away from the yoke 3. This results in accessibility to the examination subject being virtually unimpeded by the antenna arrangement. A conductor structure 6 is disposed in the region of the pole plate 1, and a conductor structure 7 is disposed in the region of the pole plate 2. Both conductor structures 6 and 7 are spaced a distance "a" from the respective shieldings 4 and 5. The conductor structures 6 and 7 are connected to the shielding 4 and 5 via respective sets of capacitors 8 and 9, and 10 and 11, distributed over the width of the conductor structures 6 and 7. The conductor structures 6 and 7 can be formed by conductor runs on an insulating plate.

In order to generate a radio-frequency field, the conductor structures 6 and 7 must be supplied by current respectively flowing in opposite directions in the two structures. This occurs in the exemplary embodiment of FIG. 1 by means of a radio-frequency transmitter 12 connected to opposite ends of the conductor structures 6 and 7 via respective coaxial lines 13 and 14 and respective matching capacitors 42 and 43. The jackets of the coaxial conductors 13 and 14 are connected to the respective shieldings 4 and 5.

Cartesian coordinate axes 15 are shown in FIG. 1. The basic magnetic field $B_0$ proceeds from the pole plate 1 to the pole plate 2, i.e., in y-direction in the defined coordinate system. The magnetic field component $B_1$, generated by the antenna arrangement, must proceed perpendicularly to the basic magnetic field $B_0$. The magnetic field component $B_1$ proceeds in x-direction in the exemplary embodiment of FIG. 1.

The distance "a" between the shielding 4 and the conductor structure 6, and between the shielding 5 and the conductor structure 7, is maintained optimally small so that the examination space is not reduced in size any more than necessary, and so that an optimally small spacing between the pole plates 1 and 2, in order to maintain a prescribed examination space, can be achieved. The efficiency of the antenna arrangement becomes poorer as, the conductor structures 6 and 7 are arranged disposed closer to the respective shieldings 4 and 5. For transmission antennas, however, this is more likely to play a subordinate role, because the losses in efficiency can be compensated by using a more powerful transmitter. A small spacing is more critical when the antenna arrangement is used as a reception antenna, since reduction in the efficiency in that case would be accompanied by a degradation of the signal-to-noise ratio. This can be avoided, however, by using the antenna arrangement only for transmission purposes, and using local coils for reception. In an arrangement which has already been realized, a distance a =2 cm between each conductor structure and its associated shielding has proven to be a good compromise.

The thickness of each shielding 4 and 5 is preferably twice the penetration depth (skin depth) of the radio-frequency energy, for a good shielding effect. In order to avoid eddy currents that are induced by gradient fields, the shieldings 4 and 5 can be slotted. The slots are arranged so that the eddy current paths are interrupted. By bridging the slots with capacitors, the RF shielding effect is substantially preserved.

Alternatively, the thickness of each shielding can be in the order of the penetration depth of the radio-frequency energy. This is a compromise between RF losses and gradient eddy current.

Figure 3:
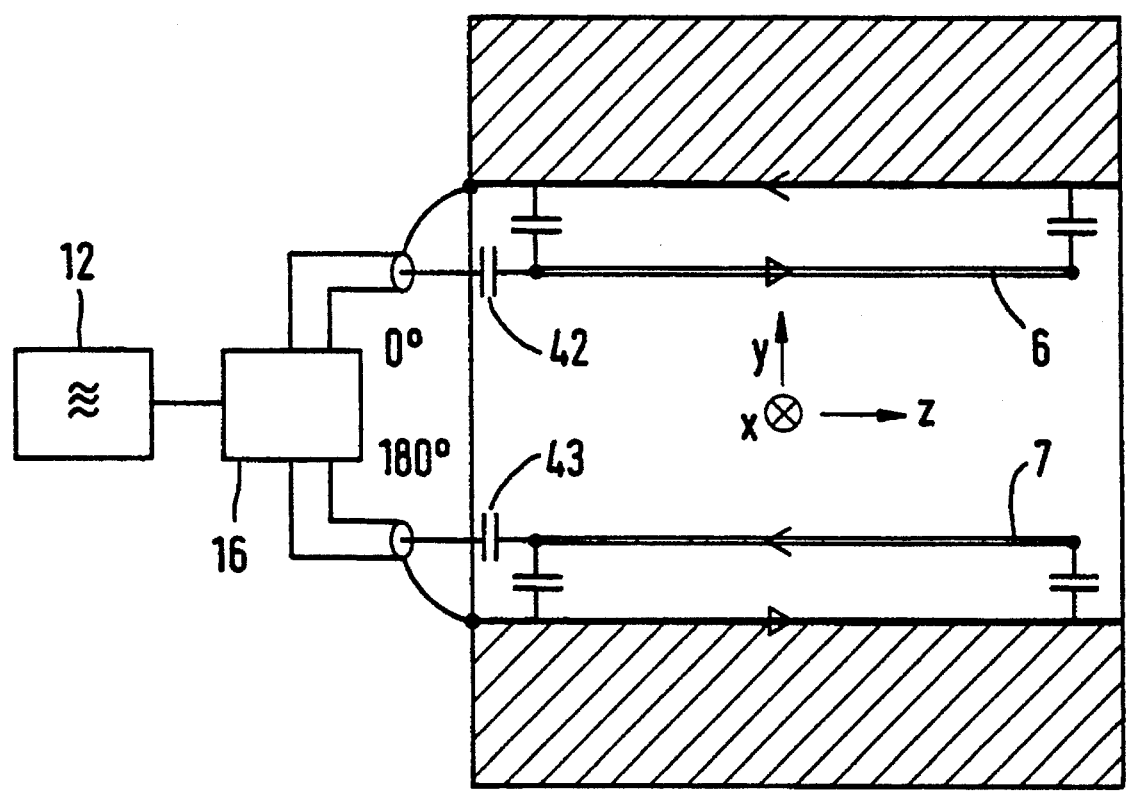
FIG. 3 is a schematic illustration of an antenna arrangement constructed in accordance with the principles of the present invention in an embodiment having a phase shifter between the two sub-antennas.

In the exemplary embodiment of FIG. 3, the high-frequency currents for the two conductor structures 6 and 7 are supplied from the same side. In order to achieve the necessary opposite directions of current flow, a phase shifter 15 is provided for shifting the current flowing in the conductor structure 7 by 180° relative to the current flowing in the conductor structure 6.

The shielded conductor arrangement is also intended to prevent emission of RF energy, which would otherwise result in an undefined interaction with other cables, components and personnel in the examination space. Due to the distribution of the current on the shielding, and the distribution of the potential associated therewith, however, a slight radio-frequency emission is still present at the open side of the U-structure.

Figure 4:
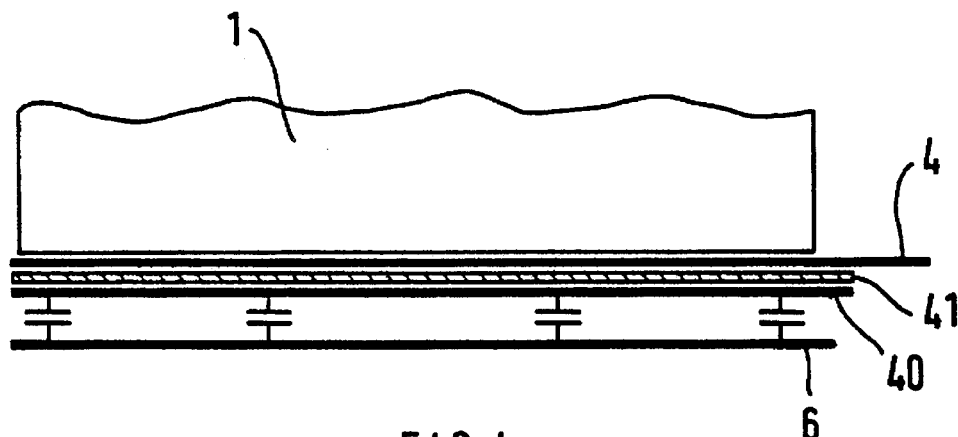
FIGS. 4 and 5 show an antenna arrangement constructed in accordance with the principles of the present invention in an embodiment having a separate return current plate.
Figure 5:
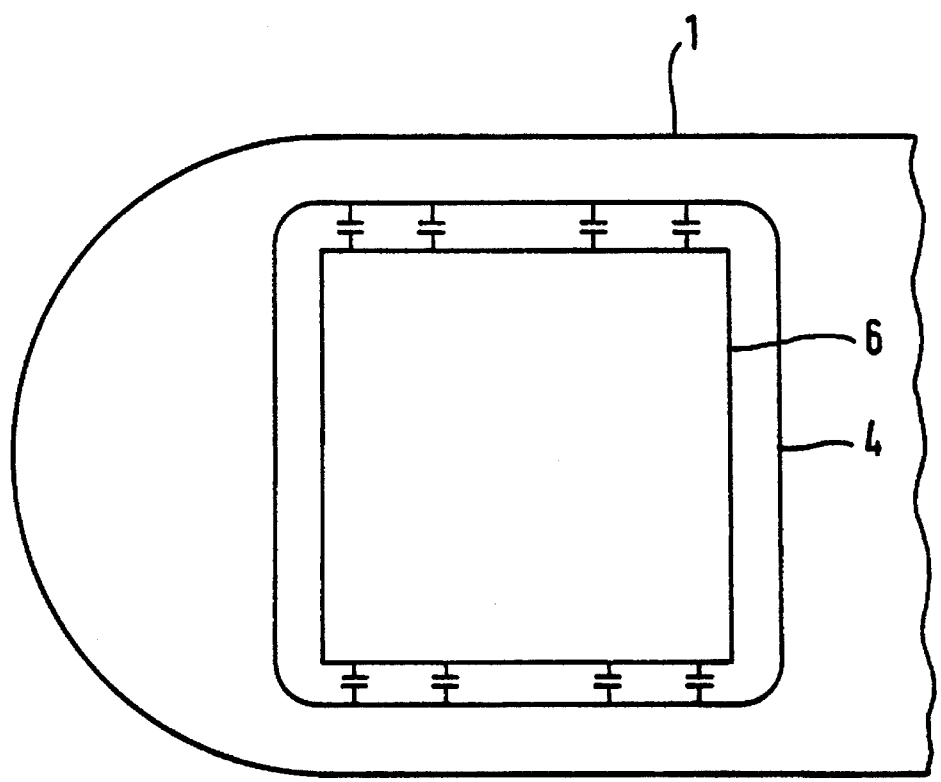

In order to reduce this remaining radio-frequency emission even more, the return currents which would normally flow through the shielding can be conducted via a separate return current plate. An exemplary embodiment of such a pole plate structure is shown in a lateral section in FIG. 4 and in plane view in FIG. 5. A return conductor plate 40 which carries the return current is placed on the shielding 4 with an insulator 41 therebetween. The thickness of the insulator 41, and thus the distance between return current plate 40 and the shielding 4, is extremely small (approximately 1 to 2 mm, but in any event less than 3 mm), so that the efficiency of the antenna arrangement is barely influenced. The shield currents and the emission, however, are significantly reduced.

The radio-frequency field must be as homogeneous as possible in the examination region in order to avoid image artifacts in nuclear magnetic resonance tomography. For that purpose, each conductor structure 6 and 7 is divided into individual conductor strips, and the current through the individual conductor strips is influenced so that the homogeneity of the radio-frequency field is optimized. Various possibilities for accomplishing this are respectively shown in FIGS. 6 through 13, for one sub-antenna of the arrangement.

Figure 6:
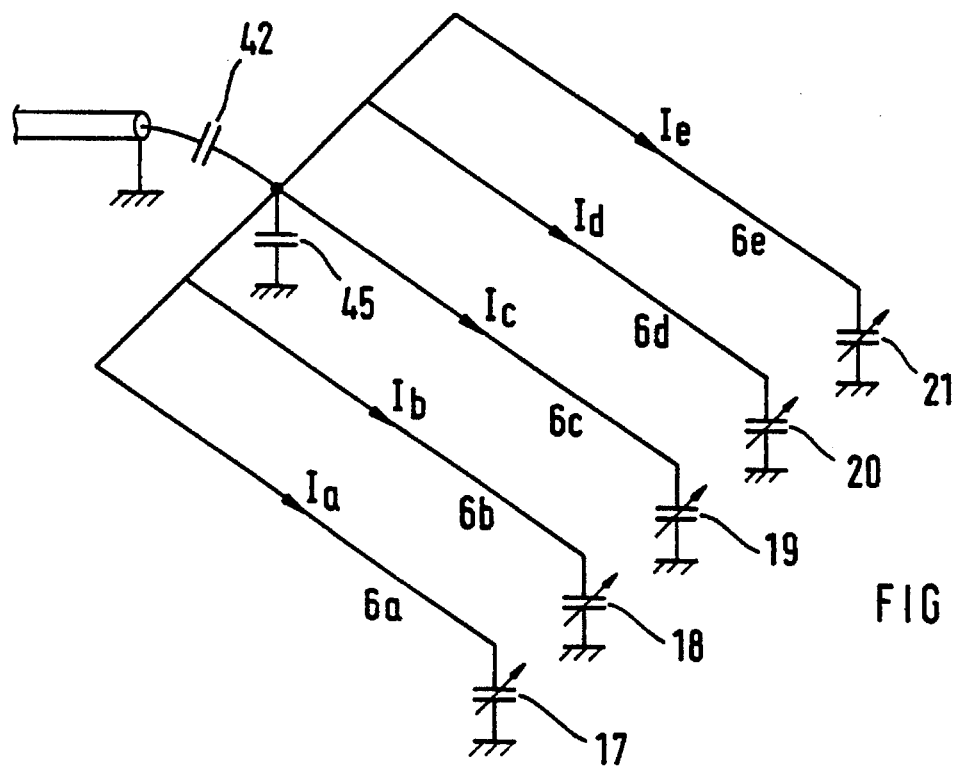
FIGS. 6 through 12 respectively illustrate different ways of coupling the conductor structure to the shielding, in accordance with the principles of the present invention, in order to improve the homogeneity of the radio-frequency field.

In the conductor structure shown in FIG. 6, individual conductor strips 6a through 6e are connected to each other only at the feed point. A capacitor 45 connected to ground is also provided at the feed point. Individual capacitors 17 through 21 connected to ground are respectively disposed at the ends of the conductor strips 6a through 6e lying opposite the feed point. The capacitors 17 through 21 are variable, so that the respective currents $l_a$ through $l_e$ flowing in the individual conductor strips 6a through 6e can be individually set for optimizing the radio-frequency field homogeneity.

Figure 7:
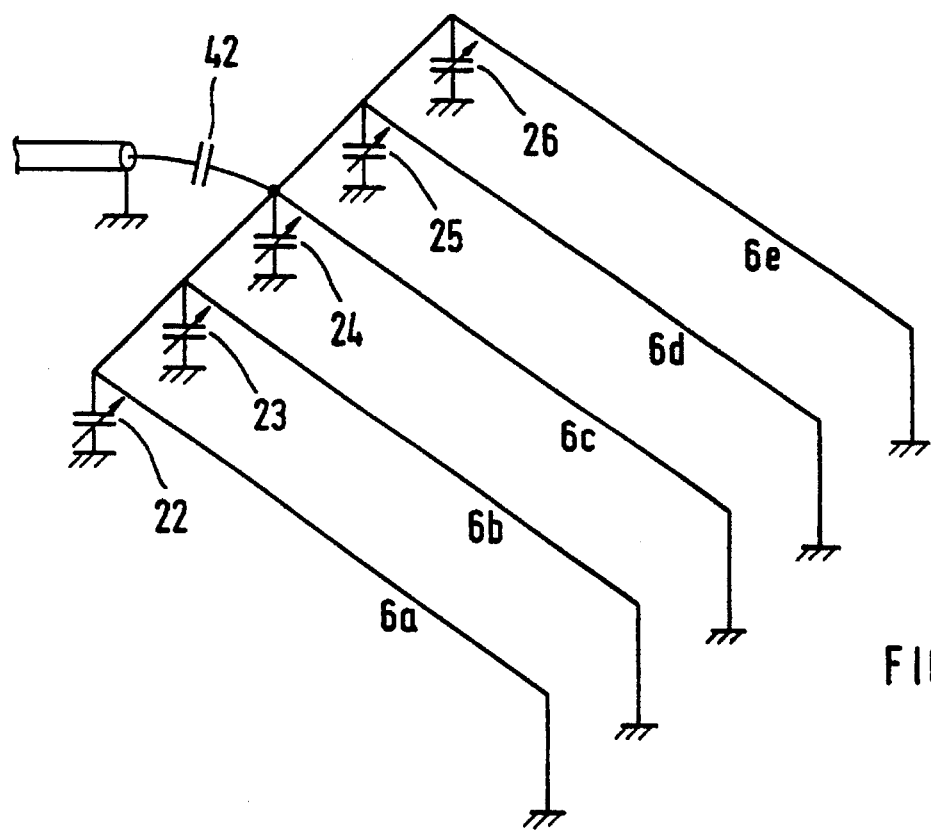

The ends of the conductor strips 6a through 6e at the feed side are also connected to each other in the exemplary embodiment of FIG. 7, with the opposite ends being individually directly connected to ground. The division of current is controlled in this embodiment by capacitors 22 through 26 respectively connected between the ends of the conductor strips 6a through 6e at the feed side and ground.

Figure 8:
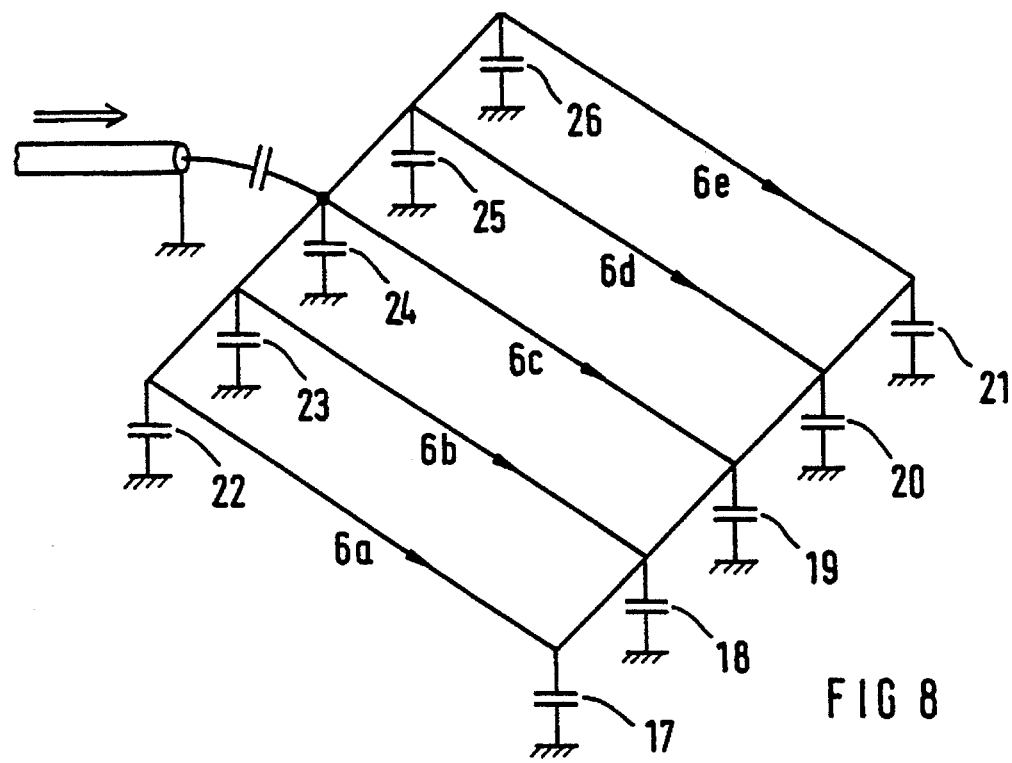

In the embodiment of FIG. 8, the conductor strips 6a through 6e are connected together at both sides. Capacitors 22 through 26 are respectively connected between the feed ends of the strips 6a through 6e and ground. Capacitors 17 through 21 are connected between the opposite ends of the strips 6a through 6e and ground. The banks of capacitors at the two ends of the conductor strips provide the capability of optimizing the current distribution.

Figure 9:
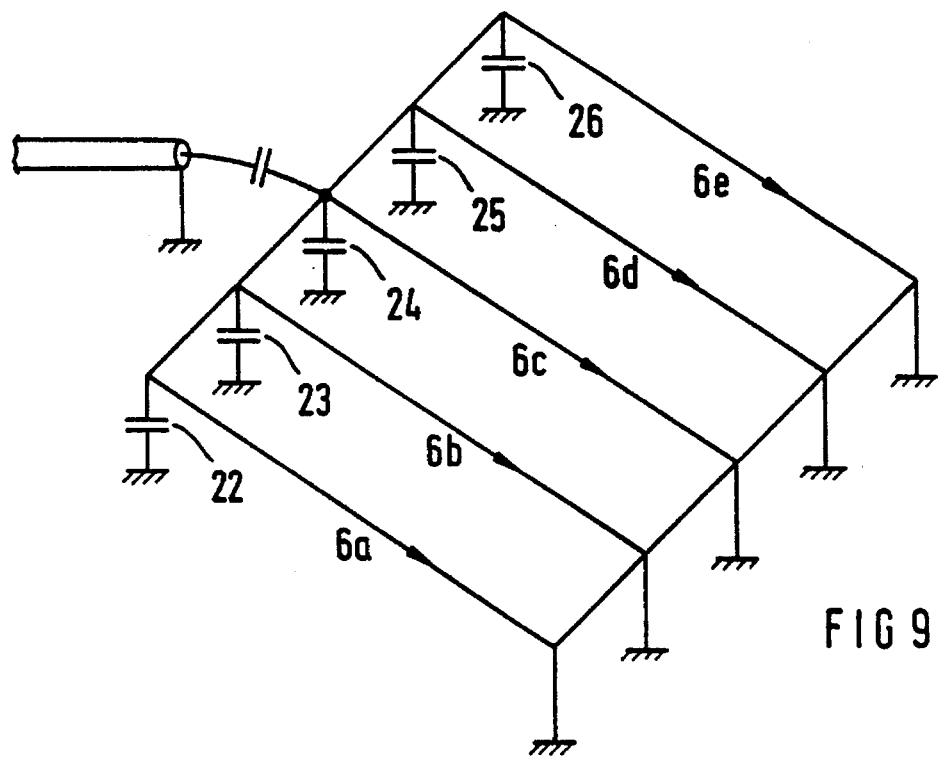

The embodiment of FIG. 9 differs from that of FIG. 8 in that a direct connection to ground is present at the ends of the respective conductor strips 6a through 6e facing away from the feed side.

Figure 10:
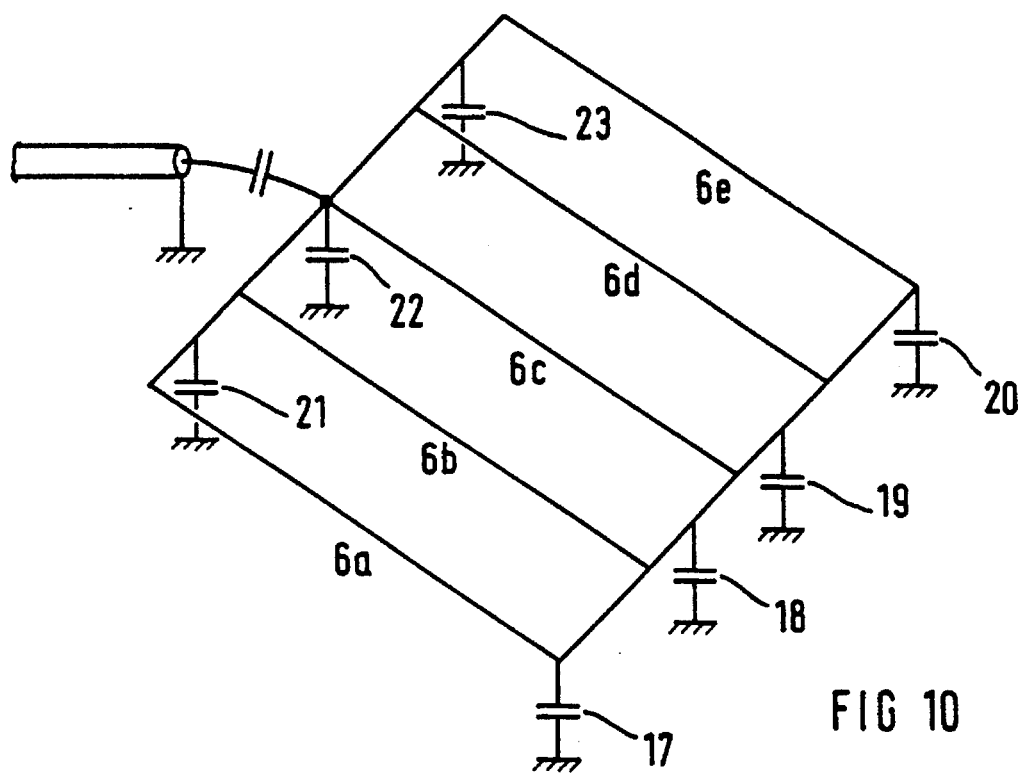

The exemplary embodiment of FIG. 10 makes use of the fact that the current distribution can be influenced not only by the capacitance of the capacitors, but also by the positioning (connection) of the capacitors. In FIG. 10, therefore, the capacitors 17 through 23 are not all connected to the respective ends of the conductor strips 6a through 6e, but instead are connected between the ends of the conductor strips, to connecting lines which electrically connect the respective ends of the conductors. The homogeneity of the radio-frequency field can be influenced by the exact connection positions of the respective capacitors.

Figure 11:
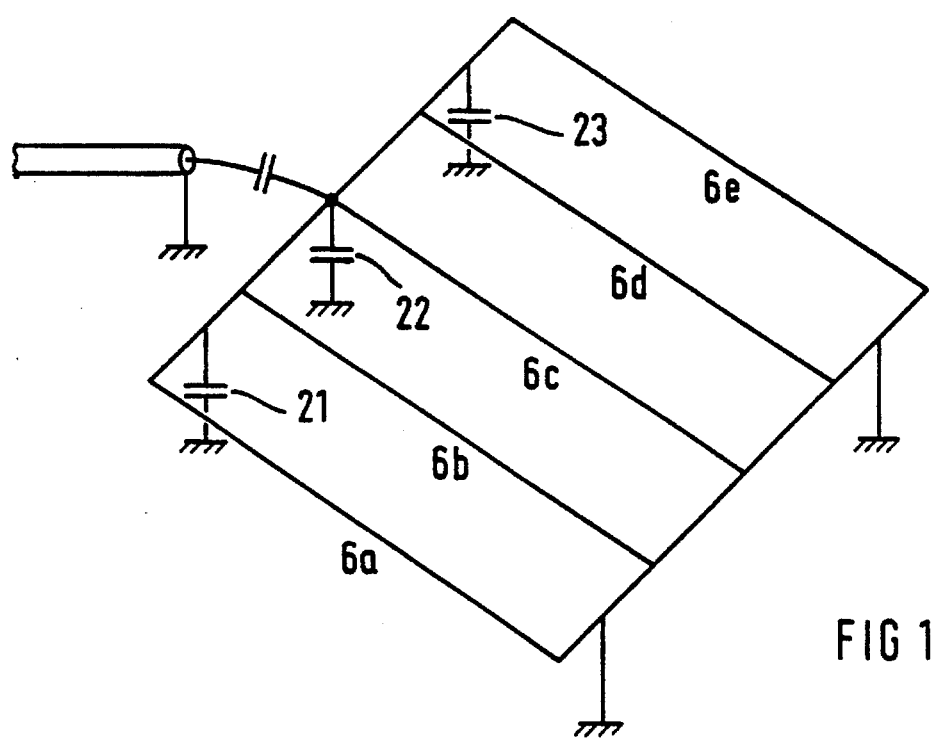

The exemplary embodiment of FIG. 11 differs from that of FIG. 8 only in that capacitors 21 through 23 connected directly to ground are provided only at the feed side, whereas two direct connections to ground are provided at the opposite side of the conductor strips 6a through 6e. The homogeneity of the basic field can be influenced by the positions of both the capacitor connections and the direct connections to ground.

Figure 12:
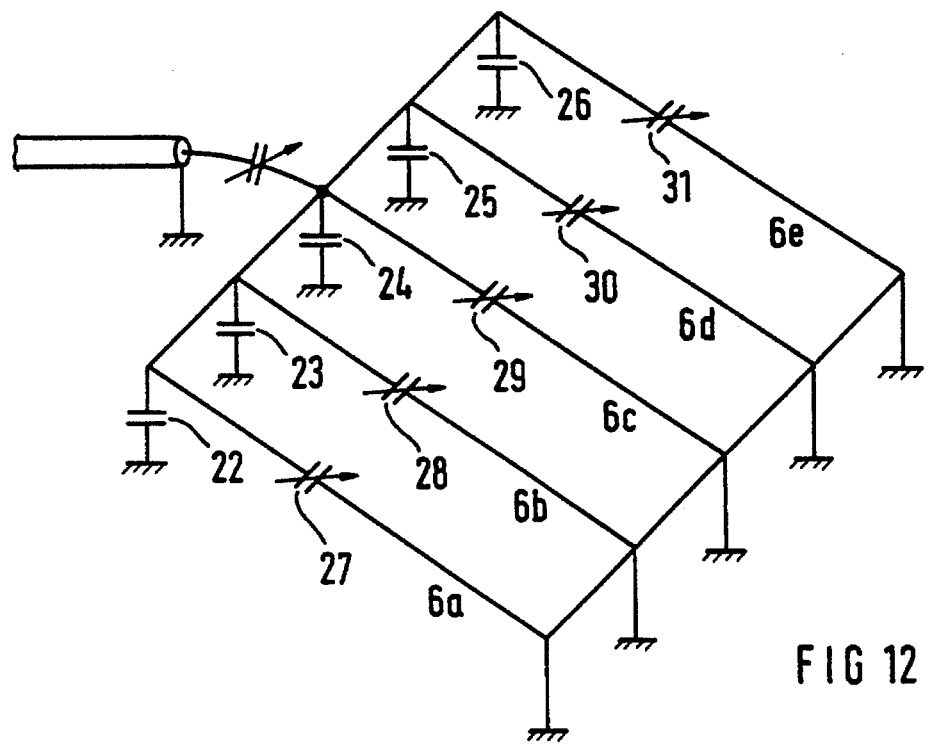

The embodiment of FIG. 12 differs from that of FIG. 9 by the use of variable capacitors 27 through 31 respectively connected in the individual conductor strips 6a through 6e, permitting the current distribution in the conductor strips to be individually set. The capacitors 27 through 31 could alternatively be replaced by inductances, however, this is not separately shown.

Figure 13:
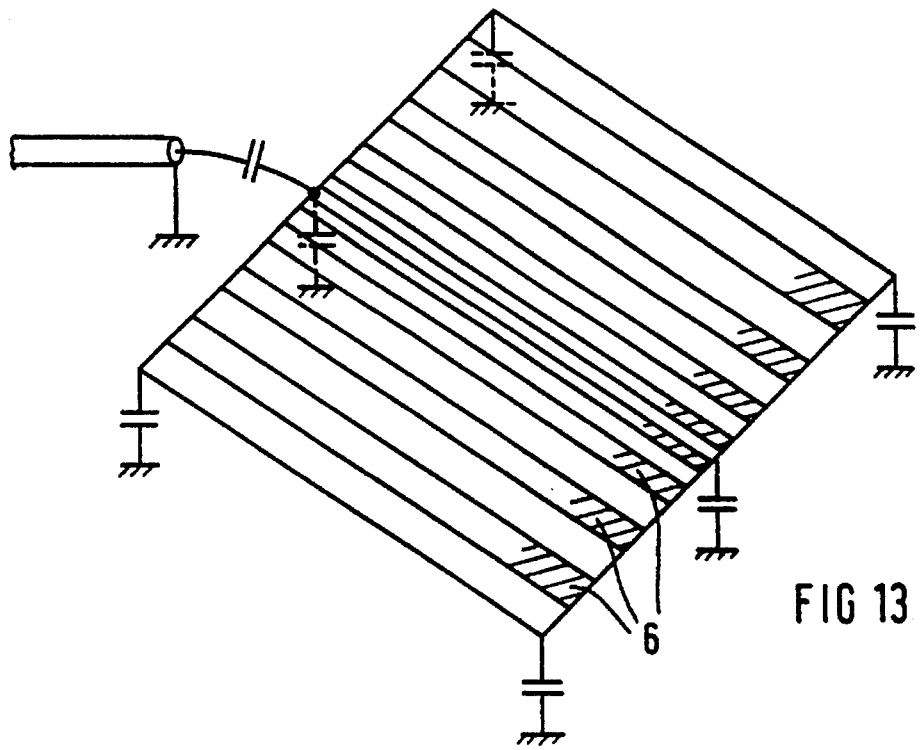
FIG. 13 shows a conductor structure in the form of individual strips for use in the antenna arrangement of the invention.

In the embodiment of FIG. 13, the width of the individual conductor strips 6 is varied over the conductor structure, with the strips proceeding from narrowest strips in the middle of the arrangement to the broadest strips at the sides of the arrangement. Additionally, the spacing between the individual conductor strips 6 is varied over the arrangement. This provides further capabilities of optimizing the homogeneity of the radio-frequency field.

Figure 14:
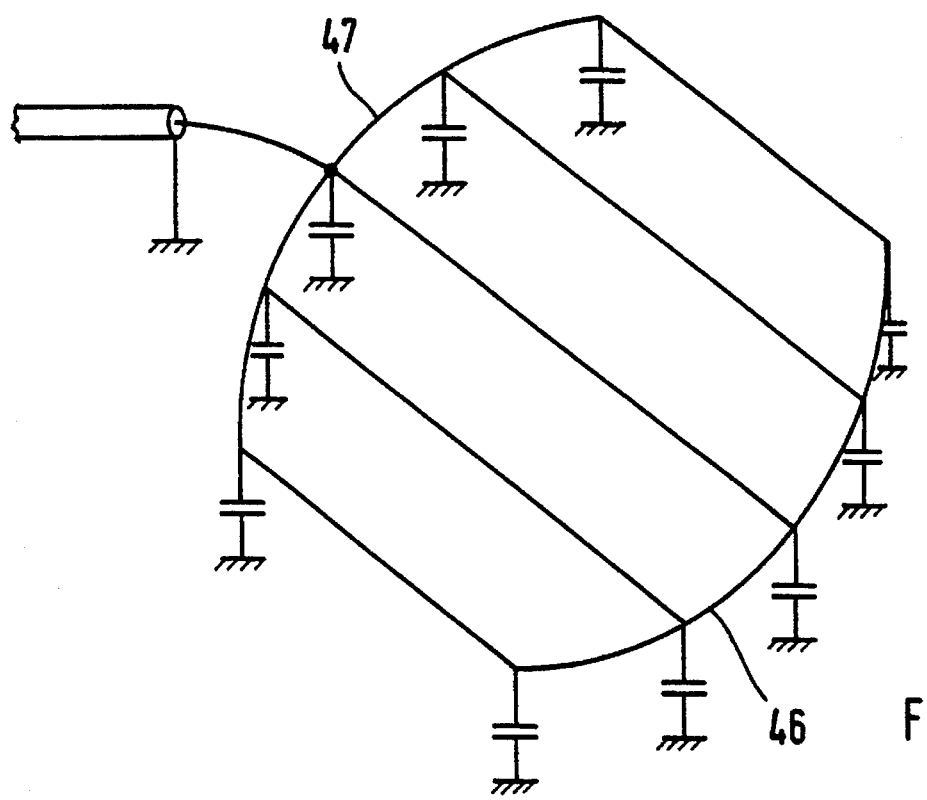
FIGS. 14 and 15 respectively illustrate conductor structures, for use in the antenna arrangement of the invention, having couture matched to the examination volume.
Figure 15:
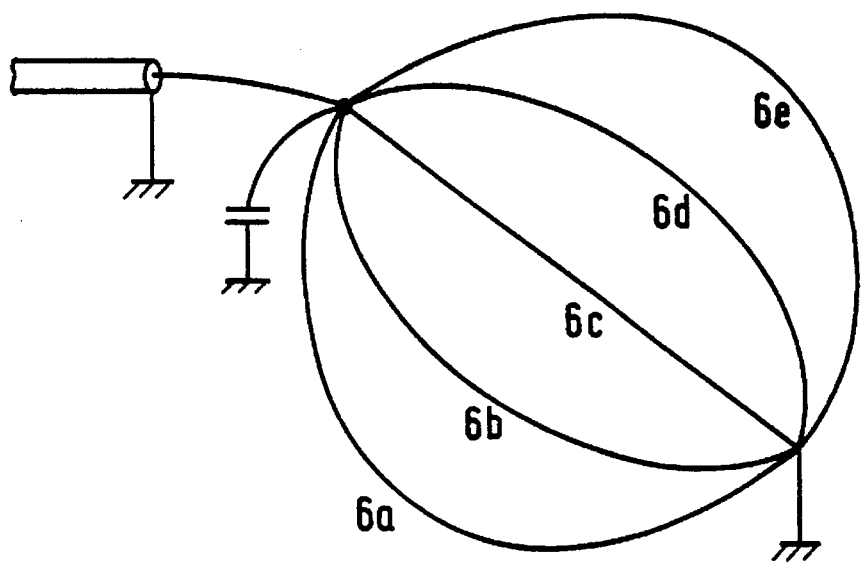

The examination volume of a typical nuclear magnetic resonance tomography apparatus is generally spherical. Conductor structures approximating a circular shape would therefore be better matched to the shape of the examination volume than the rectangular embodiments which have been heretofore described. Conductor structures in accordance with the invention, approximating a circular shape can be achieved, for example, by making the connecting conductors 46 and 47 approximate a circular shape, as shown in FIG. 14. Alternatively, the individual conductor strips 6a through 6e can be shaped as circular arcs, as shown in FIG. 15.

Figure 16:
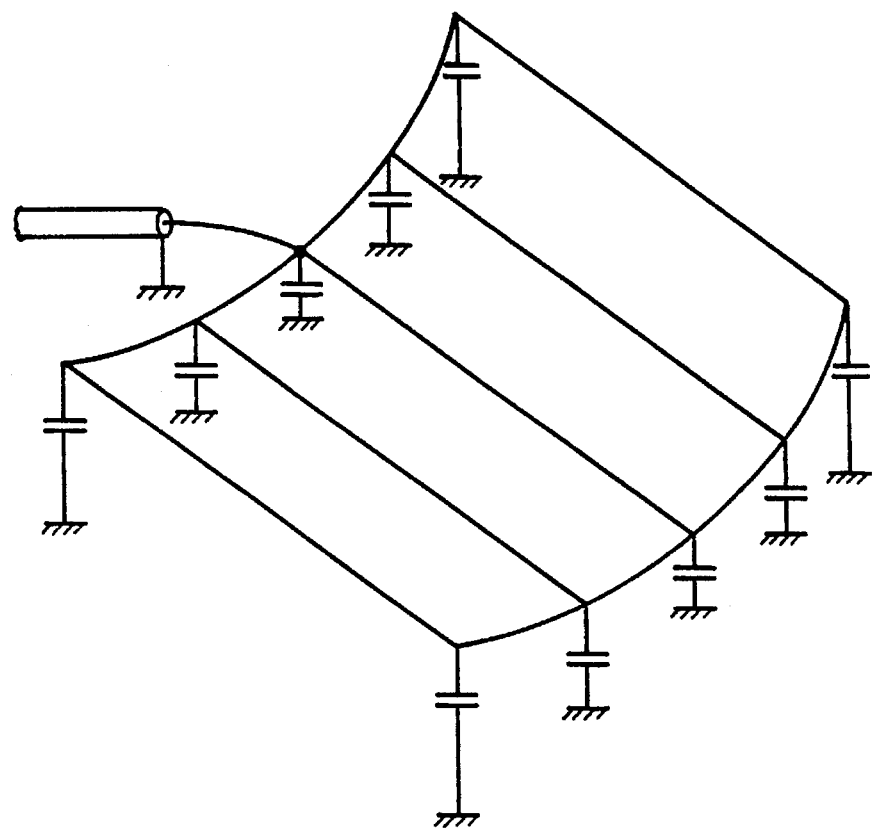
FIGS. 16 and 17 respectively show conductor structures, for use in the antenna arrangement of the invention, wherein the individual conductor strips have different spacings from the shielding.
Figure 17:
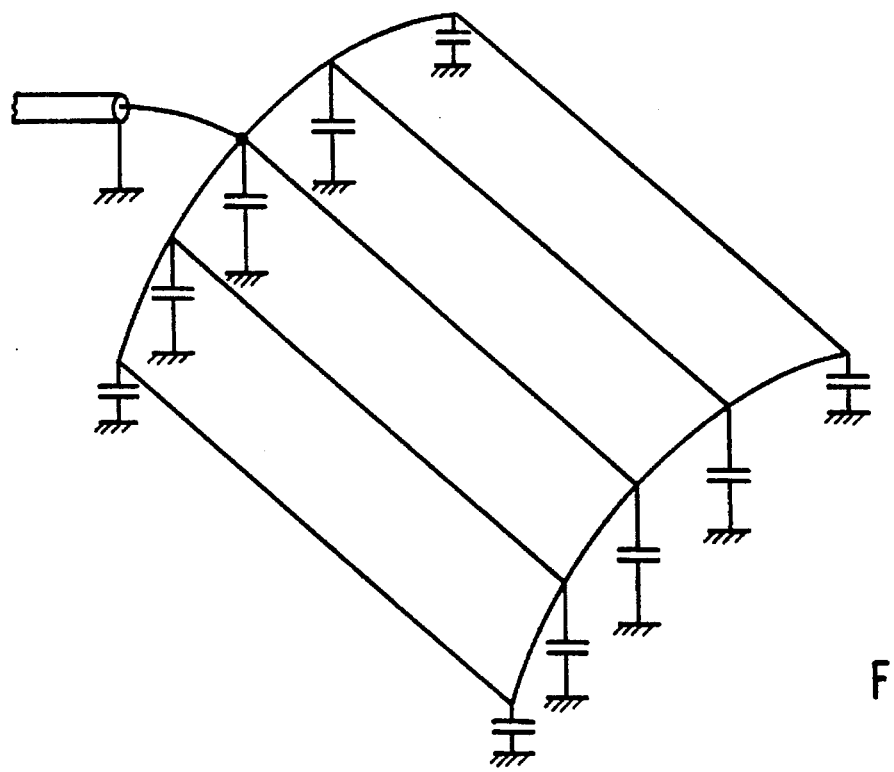

Further possibilities for optimizing the radio-frequency field homogeneity are shown in FIGS. 16 and 17, wherein the radio-frequency field is influenced by the individual conductor strips having respectively different spacings from the shielding. In the embodiment of FIG. 16 the spacing is a minimum at a center of the arrangement, and a maximum at the edges, whereas the opposite is true in the embodiment of FIG. 17.

The antenna structures described to this point are for producing a linearly polarized radio-frequency field in the examination space. Given the same excitation, however, the radio-frequency power can be reduced (theoretically, by halo with a circularly polarized radio-frequency field. Such a circularly polarized radio-frequency field can be generated with an antenna structure according to FIG. 18, which shows one sub-antenna of the structure. Each sub-antenna includes two conductor structures 6 and 6a which are rotated by 90° relative to each other, i.e., the conductor strips of the conductor structure 6 make an angle of 90° relative to the conductor strips of the other conductor structure 6a. The feed of the high-frequency current takes place through a 90° phase shifter 50, which shifts the phase of the current in the conductor structure 6a compared to that of the current in the conductor structure 6 by 90°. The magnetic field vector of the radio-frequency field thus rotates in the small z-plane, i.e., a circular polarization is present.

Figure 18:
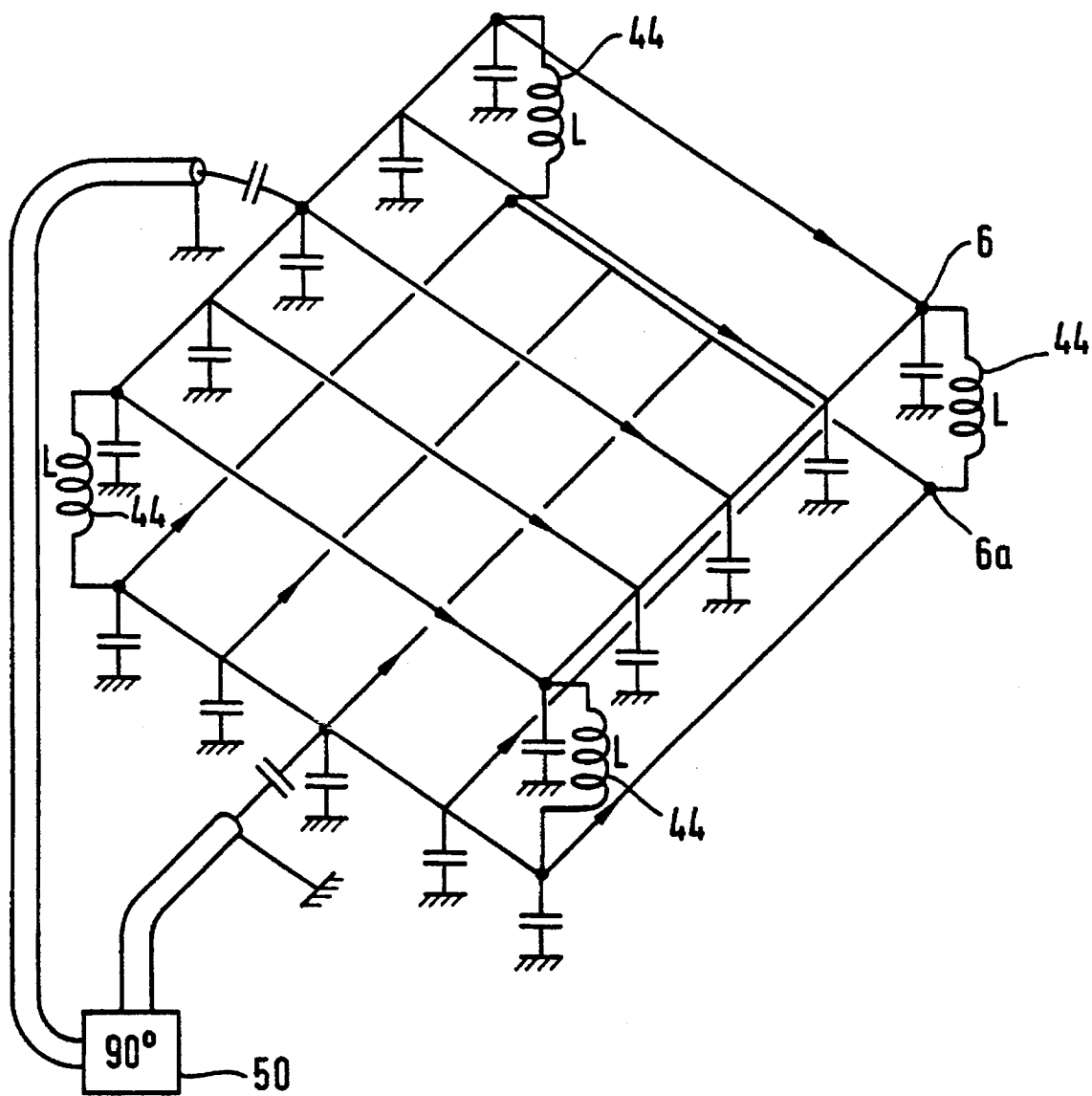
FIG. 18 shows a circularly polarizing antenna arrangement constructed in accordance with the principles of the present invention.

The conductor structures 6 and 6a preferably have the same spacing "a" from the shielding in order to achieve an optimally good circularity of the field. In practice, these structures will lie very close to each other, resulting in a pronounced, capacitative coupling of the sub-antennas. This unwanted coupling can be compensated by at least one inductance 44 connected between the two conductor systems 6 and 6a. The inductance 44 can be disposed, for example, at one corner of the two systems or, as shown in FIG. 18, at each corner.

Although modifications and changes may be suggested by those skilled in the art, it is the intention of the inventors to embody within the patent warranted hereon all changes and modifications as reasonably and properly come within the scope of their contribution to the art.

We claim as our invention:

1. An antenna arrangement for generating a substantially homogenous radio-frequency field in a nuclear magnetic resonance apparatus having means for generating a basic magnetic field between two pole plates, said antenna arrangement comprising:

a sub-antenna disposed at each pole plate;

each sub-antenna having a grounded shielding substantially impermeable to radio frequency fields, facing the pole plate at which the sub-antenna is disposed, and a conductor structure formed by at least one flat electrical conductor disposed a distance from said shielding and extending substantially parallel thereto; and means for feeding said sub-antennas with high-frequency current flowing in opposite directions in the respective conductor structures.

2. An antenna arrangement as claimed in claim 1 wherein each shielding has a thickness which is in the order of the penetration depth of said radio-frequency field in the shielding.

3. An antenna arrangement as claimed in claim 1 wherein each conductor structure consists of a plurality of individual conductor strips.

4. An antenna arrangement as claimed in claim 3 wherein said individual conductor strips have respectively different widths, said widths being selected for optimizing the homogeneity of the radio-frequency field generated by the antenna arrangement.

5. An antenna arrangement as claimed in claim 3 wherein said individual conductor strips are spaced respectively different distances from each other, said different distances being selected for optimizing the homogeneity of the radio-frequency field generated by the antenna arrangement.

6. An antenna arrangement as claimed in claim 3 wherein said individual conductor strips have respectively different widths and are spaced respectively different distances from each other, said widths and said different distances being selected in combination for optimizing the homogeneity of the radio-frequency field generated by the antenna arrangement.

7. An antenna arrangement as claimed in claim 1, for use in a nuclear magnetic resonance apparatus having gradient fields which generate eddy currents in said shielding, and wherein said shielding has a plurality of slots therein disposed for interrupting eddy current paths in said shielding.

8. An antenna arrangement as claimed in claim 1 wherein each conductor is spaced from its shielding by a distance varying across the planar conductor structure whereby the distance variation iS selected for optimizing the homogeneity of the radio-frequency field generated by the antenna arrangement.

9. An antenna arrangement as claimed in claim 3 wherein each conductor structure consists of a plurality of electrically connected, individual conductors, and wherein each conductor structure has an approximately circular shape.

10. An antenna arrangement as claimed in claim 9 wherein said individual conductors are curved within said conductor structure.

11. An antenna arrangement as claimed in claim 1 wherein each conductor structure consists of a plurality of individual, electrically connected conductors, and a plurality of capacitors, with at least one end of each conductor in each conductor structure being connected to said shielding through one of said plurality of capacitors.

12. An antenna arrangement as claimed in claim 1 wherein each conductor structure consists of a plurality of individual, electrically connected conductors, and wherein at least one end of each conductor in each conductor structure is directly connected to its shielding.

13. An antenna arrangement as claimed in claim 1 wherein each conductor structure consists of a plurality of individual, electrically connected conductors, and further comprising a plurality of capacitors respectively connecting at least one end of each conductor in each conductor structure to its shielding, said plurality of capacitors having respective capacitances selected for optimizing the homogeneity of the radio-frequency field generated by said antenna arrangement.

14. An antenna arrangement as claimed in claim 1 wherein each conductor structure consists of a plurality of individual, electrically connected conductors, and further comprising a plurality of capacitors respectively connected in said individual conductors, said plurality of capacitors having respective capacitances selected for optimizing the homogeneity of the radio-frequency field generated by said antenna arrangement.

15. An antenna arrangement as claimed in claim 1 wherein each of said conductor structure consists of a plurality of individual, electrically connected conductors, said conductors being formed by respective conductor runs on an insulating plate.

16. An antenna arrangement as claimed in claim 1 wherein each sub-antenna includes a further conductor structure, the conductor structure and the further conductor structure in each sub-antenna being identical and oriented at an angle of 90° relative to each other, and wherein said means for feeding said sub-antennas includes means for feeding each conductor structure and further conductor structure in each sub-antenna with respective currents phase-shifted by 90° relative to each other.

17. An antenna arrangement as claimed in claim 16 further comprising at least one inductance in each sub-antenna connected between the conductor structure and the further conductor structure for that sub-antenna.

18. An antenna arrangement for generating a substantially homogenous radio-frequency field in a nuclear magnetic resonance apparatus having means for generating a basic magnetic field between two pole plates, said antenna arrangement comprising:

a sub-antenna disposed at each pole plate;

each sub-antenna having a grounded shielding substantially impermeable to radio frequency fields, facing the pole plate at which the sub-antenna is disposed, a conductor structure formed by at least one flat electrical conductor disposed a distance from the shielding and extending substantially parallel thereto, and a return current plate insulated from said shielding and from said conductor structure; and means for feeding said sub-antennas with high-frequency current between the conductor structure and the return current plate in each sub-antenna, said current in said sub-antenna flowing in opposite directions.

19. An antenna arrangement as claimed in claim 18 wherein said return current plate is disposed a distance from said shielding in each sub-antenna which is less than 3 mm.

20. An antenna arrangement as claimed in claim 18 for use in a nuclear magnetic resonance apparatus having gradient fields which generate eddy currents in said shielding and in said return current plate, and wherein said shielding has a plurality of slots therein disposed for interrupting eddy current paths in said shielding.

21. An antenna arrangement as claimed in claim 18 for use in a nuclear magnetic resonance apparatus having gradient fields which generate eddy currents in said shielding and in said return current plate, and wherein said return current plate has a plurality of slots therein disposed for interrupting eddy current paths in said return current plate.

22. An antenna arrangement as claimed in claim 1, for use in a nuclear magnetic resonance apparatus having gradient fields which generate eddy currents in said shielding and in said return current plate, and wherein said shielding has a plurality of slots therein disposed for interrupting eddy current paths in said shielding and said return current plate has a plurality of slots therein disposed for interrupting eddy current paths in said return current plate.

23. An antenna arrangement as claimed in claim 18 wherein said return current plate is disposed a distance from said conductor structure in each sub-antenna selected for optimizing the homogeneity of said radio-frequency field.

24. An antenna arrangement as claimed in claim 18 wherein said distance between said shielding and said conductor structure is selected for optimizing the homogeneity of said radio-frequency field.

25. An antenna arrangement as claimed in claim 18 wherein said return current plate is disposed a first distance from said conductor structure and wherein said shielding is disposed a second distance from said conductor structure, and wherein said first and second distances in each sub-antenna are selected in combination for optimizing the homogeneity of said radio-frequency field.

26. An antenna arrangement as claimed in claim 18 wherein each shielding has a thickness which is equal to twice a penetration depth of said radio-frequency field in the shielding.

27. An antenna arrangement as claimed in claim 18 wherein each conductor structure consists of a plurality of individual conductor strips.

28. An antenna arrangement as claimed in claim 27 wherein said individual conductor strips have respectively different widths, said widths being selected for optimizing the homogeneity of the radio-frequency field generated by the antenna arrangement.

29. An antenna arrangement as claimed in claim 27 wherein said individual conductor strips are spaced respectively different distances from each other, said different distances being selected for optimizing the homogeneity of the radio-frequency field generated by the antenna arrangement.

30. An antenna arrangement as claimed in claim 27 wherein said individual conductor strips have respectively different widths and are spaced respectively different distances from each other, said widths and said different distances being selected in combination for optimizing the homogeneity of the radio-frequency field generated by the antenna arrangement.

31. An antenna arrangement as claimed in claim 27 wherein each conductor structure consists of a plurality of electrically connected, individual conductors, and wherein each conductor structure has an approximately circular shape.

32. An antenna arrangement as claimed in claim 31 wherein said individual conductors are curved within said conductor structure.

33. An antenna arrangement as claimed in claim 18 wherein each conductor structure consists of a plurality of individual, electrically connected conductors, and a plurality of capacitors, with at least one end of each conductor in each conductor structure being connected to said shielding through one of said plurality of capacitors.

34. An antenna arrangement as claimed in claim 18 wherein each conductor structure consists of a plurality of individual, electrically connected conductors, and wherein at least one end of each conductor in each conductor structure is directly connected to its shielding.

35. An antenna arrangement as claimed in claim 18 wherein each conductor structure consists of a plurality of individual, electrically connected conductors, and further comprising a plurality of capacitors respectively connecting at least one end of each conductor in each conductor structure to its shielding, said plurality of capacitors having respective capacitances selected for optimizing the homogeneity of the radio-frequency field generated by said antenna arrangement.

36. An antenna arrangement as claimed in claim 18 wherein each conductor structure consists of a plurality of individual, electrically connected conductors, and further comprising a plurality of capacitors respectively connected in said individual conductors, said plurality of capacitors having respective capacitances selected for optimizing the homogeneity of the radio-frequency field generated by said antenna arrangement.

37. An antenna arrangement as claimed in claim 18 wherein each of said conductor structure consists of a plurality of individual, electrically connected conductors, said conductors being formed by respective conductor runs on an insulating plate.

38. An antenna arrangement as claimed in claim 18 wherein each sub-antenna includes a further conductor structure, the conductor structure and the further conductor structure in each sub-antenna being identical and oriented at an angle of 90° relative to each other, and wherein said means for feeding said sub-antennas includes means for feeding each conductor structure and further conductor structure in each sub-antenna with respective currents phase-shifted by 90° relative to each other.

39. An antenna arrangement as claimed in claim 38 further comprising at least one inductance in each sub-antenna connected between the conductor structure and the further conductor structure for that sub-antenna.

40. An antenna arrangement as claimed in claim 1 wherein the respective shielding at the pole plates comprises a conductive sheet, and further comprising a conductor connecting each of said conductive sheets and forming a single unitary U-shaped sheet with said sheets forming said shielding.

41. An antenna arrangement as claimed in claim 18 wherein the respective shielding at the pole plates comprises a conductive sheet, and further comprising a conductor connecting each of said conductive sheets and forming a single unitary U-shaped sheet with said sheets forming said shielding.

42. An antenna arrangement as claimed in claim 1 wherein said conductor structure comprises a planar conductor structure.

43. An antenna arrangement as claimed in claim 18 wherein said conductor structure comprises a planar conductor structure.

* * * * *